(12) United States Patent
Gao et al.

(10) Patent No.: US 7,386,766 B2
(45) Date of Patent: Jun. 10, 2008

(54) ADDRESS GENERATION APPARATUS FOR TURBO INTERLEAVER AND DEINTERLEAVER IN W-CDMA SYSTEMS

(75) Inventors: Wen Gao, Plainsboro, NJ (US); Alton Keel, Melbourne, FL (US)

(73) Assignee: Thomson Licensing, Boulogne-Billancourt (FR)

( * ) Notice: Subject to any disclaimer, the term of this patent is extended or adjusted under 35 U.S.C. 154(b) by 135 days.

(21) Appl. No.: 10/590,557

(22) PCT Filed: Mar. 5, 2004

(86) PCT No.: PCT/US2004/006977

§ 371 (c)(1),
(2), (4) Date: Aug. 24, 2006

(87) PCT Pub. No.: WO2005/099099

PCT Pub. Date: Oct. 20, 2005

(65) Prior Publication Data
US 2007/0186129 A1    Aug. 9, 2007

(51) Int. Cl.
    *G11C 29/00*    (2006.01)
(52) U.S. Cl. ............................. 714/702; 714/755
(58) Field of Classification Search ................ 714/719, 714/746, 701, 702, 755; 375/377
    See application file for complete search history.

(56) References Cited

U.S. PATENT DOCUMENTS

| 6,223,319 | B1 * | 4/2001  | Ross et al. ............... 714/755 |
| 6,392,572 | B1   | 5/2002  | Shiu et al. |
| 6,493,815 | B1   | 12/2002 | Kim et al. |
| 6,590,951 | B1 * | 7/2003  | Kim et al. ............... 375/377 |
| 6,591,381 | B1 * | 7/2003  | Kim et al. ............... 714/701 |
| 6,668,343 | B1 * | 12/2003 | Kim et al. ............... 714/702 |
| 6,721,908 | B1 * | 4/2004  | Kim et al. ............... 714/702 |
| 6,845,482 | B2 * | 1/2005  | Yao et al. ............... 714/755 |

OTHER PUBLICATIONS

Search Report dated Jul. 7, 2004.

* cited by examiner

*Primary Examiner*—David Ton
(74) *Attorney, Agent, or Firm*—Joseph J. Laks; Jeffrey M. Navon

(57) ABSTRACT

There is provided an address generation apparatus for one of an interleaver and a deinterleaver in a Wideband Code Division Multiple Access (W-CDMA) system. The apparatus includes an address pair generator for generating an address pair (n, P(n)) in real-time for one of an interleaver operation and a deinterleaver operation that includes inter-row permutation and intra-row permutation. The address pair (n, P(n)) is generated such that, for the interleaving operation, data to be interleaved are read out from the at least one memory device using the P(n) and interleaved data are written into the at least one memory device using the n. Further, the address pair (n, P(n)) is generated such that, for the deinterleaving operation, data to be deinterleaved are read out from the at least one memory device using the n and deinterleaved data are written into the at least one memory device using the P(n).

13 Claims, 3 Drawing Sheets

US 7,386,766 B2

ADDRESS GENERATION APPARATUS FOR TURBO INTERLEAVER AND DEINTERLEAVER IN W-CDMA SYSTEMS

This application claims the benefit, under 35 U.S.C. § 365 of International Application PCT/US2004/006977, filed Mar. 5, 2004, which was published in accordance with PCT Article 21(2) on Oct. 20, 2005 in English.

BACKGROUND OF THE INVENTION

1. Field of the Invention

The present invention generally relates to Wideband Code Division Multiple Access (W-CDMA) and, more particularly, to an address generation apparatus for turbo interleavers and deinterleavers in W-CDMA systems.

2. Background of the Invention

Turbo codes are widely used in digital data transmission because of their high coding gain. A Turbo code is a built from a concatenation of two Recursive Systematic Convolutional (RSC) codes, linked together by an internal interleaver.

The internal interleaver is an important component in a Turbo encoder and greatly affects the performance of the Turbo code. Typically, a turbo interleaver is a block-type interleaver with inter-row permutation, intra-row permutation and pruning. However, other types of interleavers may be used for turbo codes including, for example, random interleavers. In a block interleaver, the data are read in by rows and form a matrix, with certain paddings if the data does not fill up the matrix. After permutations are performed within rows and among rows, the data are read out in columns with pruning of the paddings. A random interleaver rearranges the data using a randomly generated permutation pattern.

Commonly, interleavers/deinterleavers are implemented by using a memory device to store the address pattern of the interleavers/deinterleavers. However, in W-CDMA systems, the length of a Turbo code block can vary from 40 bits to 5114 bits. Hence, 5075 different address patterns need to be stored in the memory device, resulting in the need for a significantly large memory device that may not be practical.

Accordingly, it would be desirable and highly advantageous to have an address generation apparatus for turbo interleavers and deinterleavers that overcomes the above-identified deficiencies of the prior art.

SUMMARY OF THE INVENTION

The problems stated above, as well as other related problems of the prior art, are solved by the present invention, an address generation apparatus for turbo interleavers and deinterleavers in Wideband Code Division Multiple Access (W-CDMA) systems. Advantageously, the present invention may be used with respect to both Turbo encoders and decoders.

According to an aspect of the present invention, there is provided an address generation apparatus for one of an interleaver and a deinterleaver in a Wideband Code Division Multiple Access (W-CDMA) system. The apparatus includes an address pair generator for generating an address pair (n, P(n)) in real-time for one of an interleaver operation and a deinterleaver operation that includes inter-row permutation and intra-row permutation. The address pair (n, P(n)) is generated such that, for the interleaving operation, data to be interleaved are read out from the at least one memory device using the P(n) and interleaved data are written into the at least one memory device using the n. Further, the address pair (n, P(n)) is generated such that, for the deinterleaving operation, data to be deinterleaved are read out from the at least one memory device using the n and deinterleaved data are written into the at least one memory device using the P(n).

According to another aspect of the present invention, there is provided a method of address generation for at least one of an interleaver and a deinterleaver in a Wideband Code Division Multiple Access (W-CDMA) system. The method includes the step of generating an address pair (n, P(n)) in real-time for one of an interleaver operation and a deinterleaver operation that includes inter-row permutation and intra-row permutation. The address pair (n, P(n)) is generated such that, for the interleaving operation, data to be interleaved are read out from the at least one memory device using the P(n) and interleaved data are written into the at least one memory device using the n. Further, the address pair (n, P(n)) is generated such that, for the deinterleaving operation, data to be deinterleaved are read out from the at least one memory device using the n and deinterleaved data are written into the at least one memory device using the P(n).

According to another aspect of the present invention, there is provided a method of real-time address generation for an interleaver in a Wideband Code Division Multiple Access (W-CDMA) system. The interleaver is for interleaving a data sequence having a length K. A row value $X_r$ and a column value $X_c$ are computed using a number of rows in an interleaver matrix. A new row value $X_{r,new}$ and a new column value $X_{c,new}$ are computed according to a row permutation function $PR(X_r)$ and column permutation function $PC(T(X_r,X_c))$. An address pair (n, P(n)) is generated for an interleaver operation when the P(n) is less than a length of the data sequence K. The address pair (n, P(n)) is generated such that data to be interleaved are read out from at least one memory device using the P(n) and interleaved data are written into the at least one memory device using the n. $P(n)=(X_{r,new}*C+X_{c,new})$, where C is a number of columns in the matrix.

These and other aspects, features and advantages of the present invention will become apparent from the following detailed description of preferred embodiments, which is to be read in connection with the accompanying drawings.

DETAILED DESCRIPTION OF THE INVENTION

The present invention is directed to an address generation apparatus for turbo interleavers and deinterleavers in Wideband Code Division Multiple Access (W-CDMA) systems. It is to be appreciated that the present invention may be utilized for both turbo encoders and decoders. Advantageously, the present invention reduces the size(s) of memory devices required for interleaving and deinterleaving in W-CDMA systems by generating an interleaving/deinterleaving address pair in real-time.

For the sake of illustration, a description will now be given of a turbo encoder to which the present invention may be applied. However, as noted, above, the present invention is not limited to only turbo encoders, nor to only turbo encoders as described below. That is, given the teachings of the present invention provided herein, one of ordinary skill in the related art will contemplate these and various other implementations of the present invention, while maintaining the spirit and scope of the present invention.

It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof) that is executed via the operating system. In addition, various other peripheral devices may be connected to the computer platform such as an additional data storage device and a printing device.

It is to be further understood that, because some of the constituent system components and method steps depicted in the accompanying Figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

Figure 1:
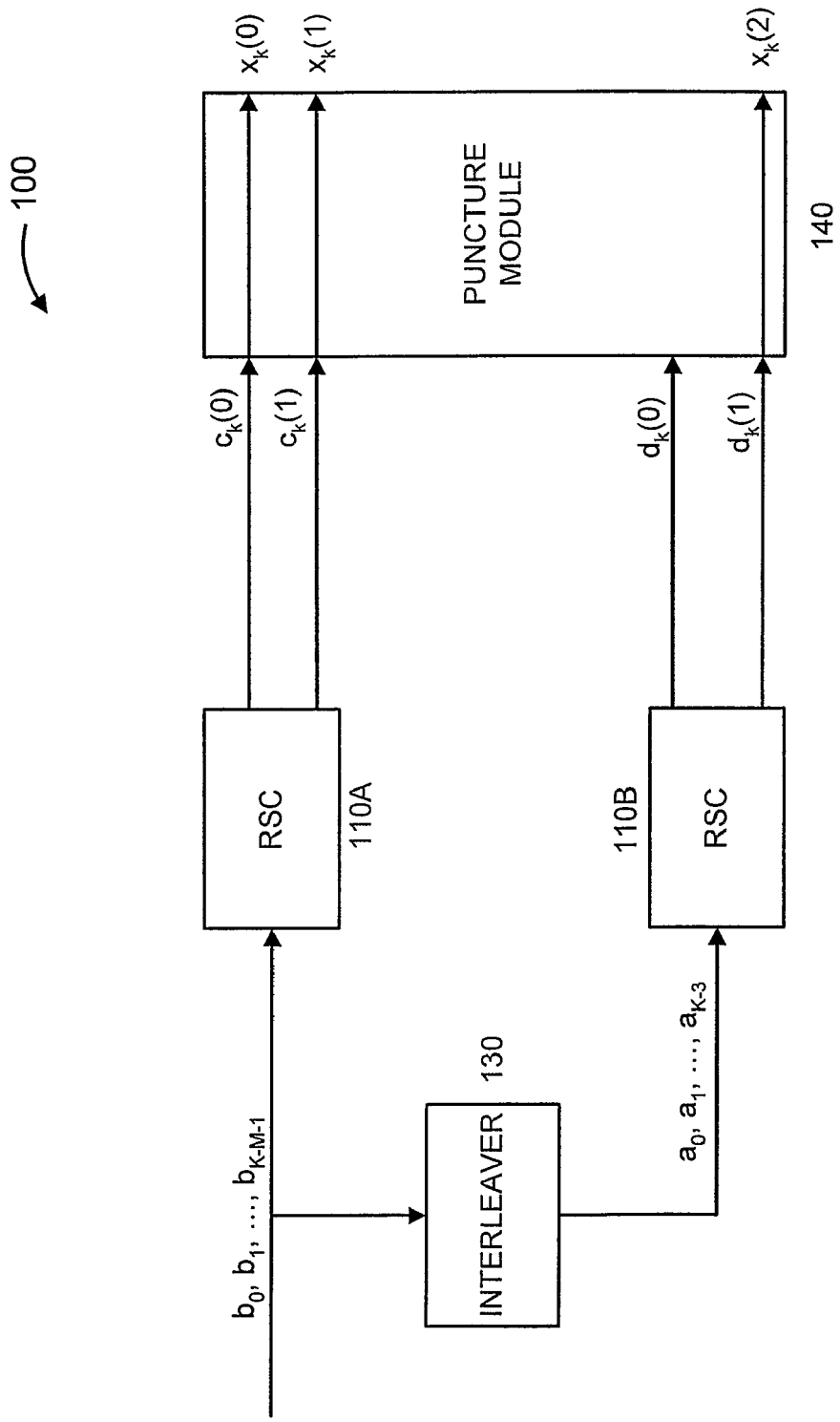
FIG. 1 is a block diagram illustrating a turbo encoder 100 to which the present invention may be applied, according to an illustrative embodiment of the present invention.

FIG. 1 is a block diagram illustrating a turbo encoder 100 to which the present invention may be applied, according to an illustrative embodiment of the present invention. A turbo code is a generated by the turbo encoder 100 from a concatenation of two Recursive Systematic Convolutional (RSC) codes 110A & 110B that are linked together by an internal interleaver 130. A puncture module 140 punctures certain inputs bits, depending upon a current operation. The puncture module 140 reduces data redundancy by reducing the number of redundant bits that are to be transmitted in a subsequent transmission.

The interleaver 130 is a block-type interleaver with inter-row permutation, intra-row permutation and pruning. The data are read in by rows and form a matrix, with certain paddings if the data does not fill up the matrix. After permutations are performed within rows and among rows, the data are read out in columns with pruning of the paddings.

A simple and common way to implement a Turbo interleaver is to use a memory to store the interleaver pattern P(n), which means the n-th interleaved data is in the P(n)-th position of the original data sequence. Thus, the interleaved data can be read out using the P(n) to address the original data sequence. However, this may not be practical if P(n) is not known in advance or the size of the memory is very large, the latter being a particular problem for Turbo interleavers and deinterleavers in W-CDMA systems. Accordingly, the present invention provides the capability to generate P(n) online, that is, in real-time.

The present invention will focus on an simple and efficient implementation of a block interleaver and deinterleaver that produces the pattern P(n) online. It is presumed that the original data (to be interleaved) is stored in a storage buffer. For an interleaving operation, the P(n)-th original data is read out from the storage buffer and written into the n-th position in an interleaving buffer. For a deinterleaving operation, the n-th interleaved data is read out from the storage buffer and written into the P(n)-th position in a deinterleaving buffer. Hence, if we can generate the pair (n, P(n)), the interleaving and deinterleaving operations can be carried out easily.

Initially, a description will be given of a general block interleaver according to an illustrative embodiment of the present invention, followed by a description of the generation of the address pair (n, P(n)) for a Turbo interleaver/deinterleaver according to an illustrative embodiment of the present invention.

Let the length of the data sequence be K. The block matrix has R rows and C columns, where K<=R*C. The original data (to be interleaved) are written into the block matrix row by row, successively starting from the 0-th row and ending at the (R−1)-th row. A certain number of paddings are appended if the matrix is not filled. There is a general permutation PC(c), c=0, ..., C−1. The intra-row permutation pattern $PC_r$(c), c=0, ..., C−1, r=0, ..., R−1, can be generated from the general permutation PC (c), where $PC_r(c) = PC(T(r, c))$, where T is a one-to-one mapping: x→y, where x, y is in the set {0, 1, ..., C−1} for a specified r and can be generated on the fly. After intra-row permutations, the rows of the matrix are permutated based on the pattern PR(r), r=0, ..., R−1. At the end, the data is read out in columns successively starting from the 0-th column and ending at the (C−1)-th column, with the pruning of the data paddings.

Figure 2:
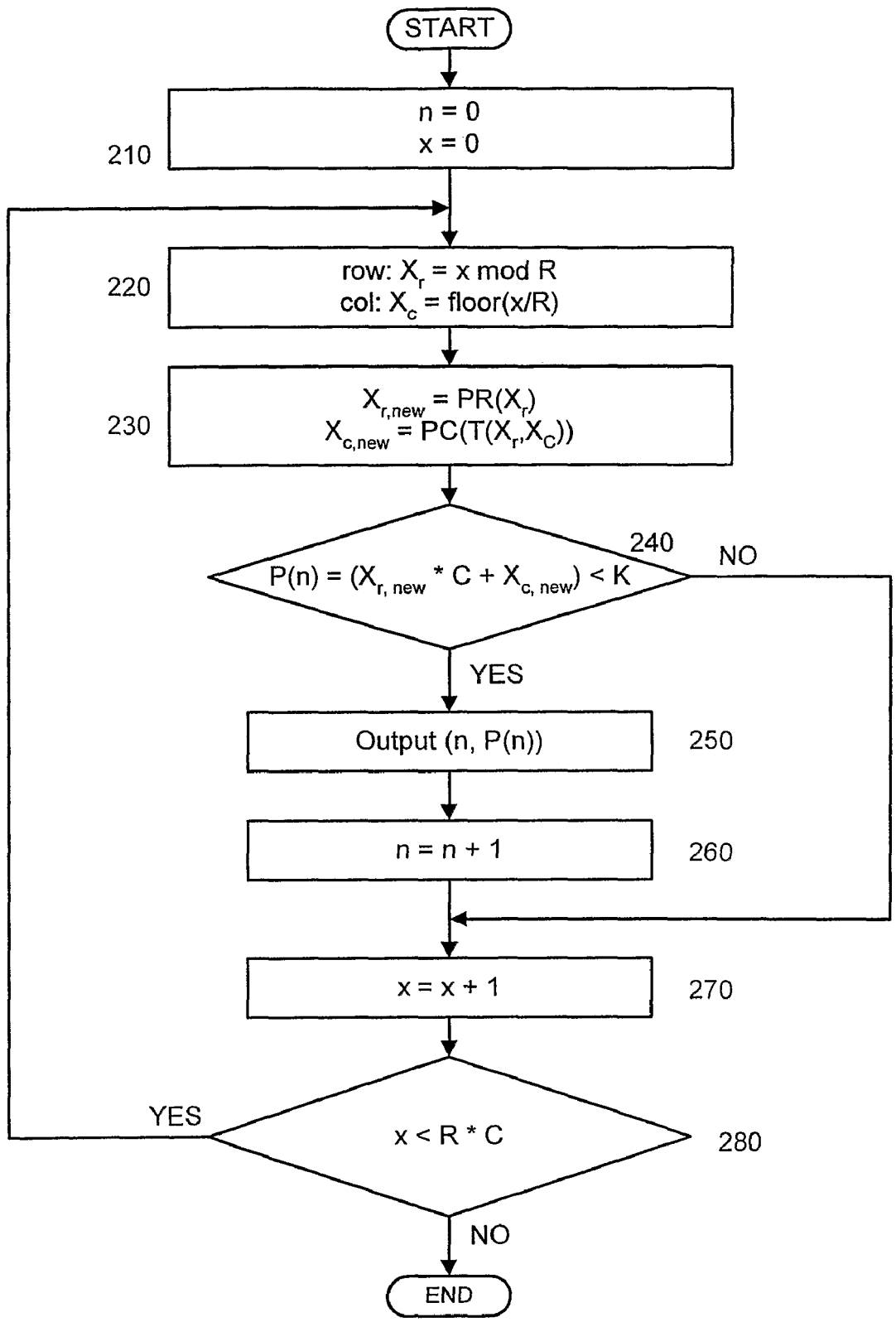
FIG. 2 is a flow diagram illustrating a method for generating an address pair for a turbo block interleaver, according to an illustrative embodiment of the present invention.

FIG. 2 is a flow diagram illustrating a method for generating an address pair for a turbo block interleaver, according to an illustrative embodiment of the present invention. "x" and 'n' are used herein to represent variables for a counter or a counting function.

At step 210, initial conditions are set, including setting the variables "x" and "n" equal to zero.

At step 220, a row value $X_r$ and a column value $X_c$ are computed using the number of rows in an interleaver matrix, i.e., R.

At step 230, a new row value ($X_{r,new}$) and a new column value ($X_{c,new}$) are computed, according to a row permutation function $PR(X_r)$ and column permutation function $PC(T(X_r, X_c))$.

At step 240, it is determined whether the generated value P(n) is less than the length of the data sequence K. If so, the method proceeds to step 250. Otherwise, the method proceeds to step 270. The determination performed at step 240 involves computing P(n) as the sum of $X_{c,new}$ and ($X_{r,new}$ multiplied by C). That is, $$P(n) = X_{r,new} * C + X_{c,new}$$

At step 250, the address pair (n, P(n)) is output.

At step 260, n is incremented by 1.

At step 270, x is incremented by 1.

At step 280, it is determined whether x is less than the product of R (the number of rows of the block matrix) and C (the number of columns of the block matrix). If so, then the method returns to step 220. Otherwise, the method is terminated.

Figure 3:
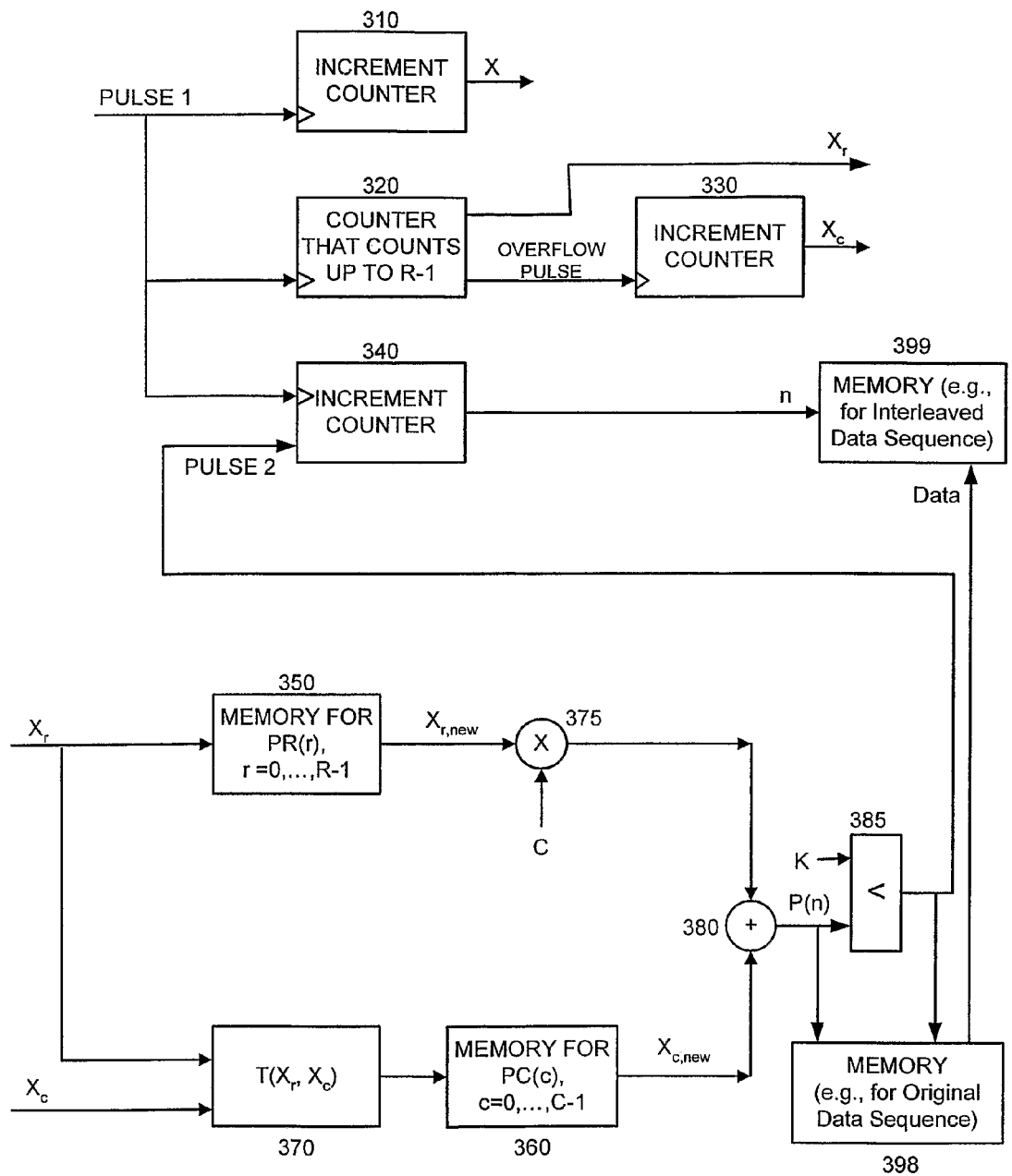
FIG. 3 is a block diagram illustrating an apparatus 200 for generating an address pair for a turbo block interleaver, according to an illustrative embodiment of present invention.

FIG. 3 is a block diagram illustrating an apparatus 300 for generating an address pair for a turbo block interleaver, according to an illustrative embodiment of the present invention. The apparatus 300 includes a first counter 310, a second counter 320, a third counter 330, and a fourth counter 340. The apparatus 300 further includes a first memory device 350, a second memory device 360, a permutation module 370, a multiplier 375, an adder 380, a comparator 385, a third memory device 399, and a fourth memory device 398. It is to be appreciated that blocks 310, 320, 330, and 340 correspond to a hardware implementation of steps 220, 260, and 270 of the method of FIG. 2, and that blocks 350, 360, 370, 375, 380, and 385 correspond to a hardware implementation of steps 230, 240, and 250 of the method of FIG. 2. The counter 310 is an increment counter having "pulse 1" as an input and "x" as an output. The counter 320 is a counter that counts up to R−1, and has the "pulse 1" as an input and "Xr" and an "overflow pulse" as outputs. The counter 330 is an increment counter having the "overflow pulse" (output from counter 320) as an input and "Xc" as an output. The counter 340 is an increment counter having "pulse 2" as an input and "n" as an output.

The "pulse 1" is generated when the decision of step 270 in FIG. 2 is equal to a logic True, while the "pulse 2" is generated when the decision of step 250 in FIG. 2 is equal to a logic True.

The permutation tables PR (r), r=0,1, ..., R−1 and PC(c), c=0, 1, ..., C−1 are stored in the first and the second memory devices 350 and 360, respectively, which are used as lookup tables. Xr and Xc are input to the permutation module 370, and Xr is also input to the first memory device 350. The output of the permutation module 370 is applied to the second memory device 360. Xr, new is output from the first memory device 350 and input to the multiplier 375 that also has columns "C" as an input. Xc, new is output from the second memory device 360 and is then input, together with the output of the multiplier 375, to the adder 380. The output of the adder 380 is then applied to the comparator 385 along with K (the length of the data sequence), to determine whether the value of P(n) is less than K. The output of the comparator 385 is a "pulse 2" signal that is input to counter 340.

For a fixed Xc, if T(Xr, Xc)=Xc, then all the rows use the same intra-row permutation. This type of interleaver usually is used as a channel interleaver. For a Turbo interleaver, T(Xr, Xc) is usually different for different Xr to achieve more randomness, such as a Turbo interleaver corresponding to W-CDMA standards.

For an interleaving operation, data is read from the fourth memory 398 corresponding to the original data sequence when "pulse 2" is TRUE and is written into the third memory 399 corresponding to the interleaved data sequence. For a deinterleaving operation, the direction of the data signal between the third and fourth memories 399, 398 is reversed (i.e., the data is read from the third memory 399 corresponding to the interleaved data sequence and is written into the fourth memory 398 corresponding to the original data sequence when "pulse 2" is true).

Thus, the present invention addresses the problem of the prior art in requiring memory devices with very large storage capacities for interleavers and deinterleavers in W-CDMA systems. By computing an address pair for such interleavers and deinterleavers in real-time, the present invention obviates the need for such large memory capacity and corresponding expense associated therewith.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

The invention claimed is:

1. An address generation apparatus for one of an interleaver and a deinterleaver in a Wideband Code Division Multiple Access (W-CDMA) system, the apparatus comprising:
   at least one memory device; and
   an address pair generator for generating an address pair (n, P(n)) in real-time for one of an interleaver operation and a deinterleaver operation that includes inter-row permutation and intra-row permutation,
   wherein the address pair (n, P(n)) is generated such that, for the interleaving operation, data to be interleaved are read out from the at least one memory device using the P(n) and interleaved data are written into the at least one memory device using the n, and
   wherein the address pair (n, P(n)) is generated such that, for the deinterleaving operation, data to be deinterleaved are read out from the at least one memory device using the n and deinterleaved data are written into the at least one memory device using the P(n).

2. The address generation apparatus of claim 1, further comprising at least one memory device, and wherein patterns for the inter-row permutation and the intra-row permutation are stored in said at least one memory device prior to the one of the interleaver operation and the deinterleaver operation.

3. The address generation apparatus of claim 1, wherein the interleaver and the deinterleaver are of a block type.

4. The address generation apparatus of claim 1, wherein the interleaver and the deinterleaver are of a Turbo type.

5. A method of address generation for at least one of an interleaver and a deinterleaver in a Wideband Code Division Multiple Access (W-CDMA) system, the method comprising the steps of:
   generating an address pair (n, P(n)) in real-time for one of an interleaver operation and a deinterleaver operation that includes inter-row permutation and intra-row permutation,
   wherein the address pair (n, P(n)) is generated such that, for the interleaving operation, data to be interleaved are read out from the at least one memory device using the P(n) and interleaved data are written into the at least one memory device using the n, and
   wherein the address pair (n, P(n)) is generated such that, for the deinterleaving operation, data to be deinterleaved are read out from the at least one memory device using the n and deinterleaved data are written into the at least one memory device using the P(n).

6. The method of claim 5, further comprising the step of pre-storing patterns for the inter-row permutation and the intra-row permutation prior to the one of the interleaving operation and the deinterleaving operation.

7. The method of claim 5, wherein the interleaver and the deinterleaver are of a block type.

8. The method of claim 5, wherein the interleaver and the deinterleaver are of a Turbo type.

9. A method of real-time address generation for an interleaver in a Wideband Code Division Multiple Access (W-CDMA) system, the interleaver for interleaving a data sequence having a length K, the method comprising the steps of:

computing a row value $X_r$ and a column value $X_c$ using a number of rows in an interleaver matrix;

computing a new row value $X_{r,new}$ and a new column value $X_{c,new}$ according to a row permutation function $PR(X_r)$ and column permutation function $PC(T(X_r, X_c))$; and generating an address pair (n, P(n)) for an interleaver operation when the P(n) is less than a length of the data sequence K, the address pair (n, P(n)) being generated such that data to be interleaved are read out from at least one memory device using the P(n) and interleaved data are written into the at least one memory device using the n, and wherein $P(n)=(X_{r,new}*C+X_{c,new})$, and the C is a number of columns in the matrix.

10. The method of claim 9, further comprising the steps of:

initially setting the n and a variable x to zero, prior to said step of computing the row value $X_r$ and the column value $X_c$;

returning to said step of computing the row value $X_r$ and the column value $X_c$, when a current value of x is not less than a product of the number of columns in the matrix and a number of rows in the matrix.

11. The method of claim 9, further comprising the step of pre-storing patterns for the inter-row permutation and the intra-row permutation prior to the interleaving operation.

12. The method of claim 9, wherein the interleaver is of a block type.

13. The method of claim 9, wherein the interleaver is of a Turbo type.

* * * * *